United States Patent [19]

Rappaport

[11] Patent Number: 4,467,203

[45] Date of Patent: Aug. 21, 1984

[54] LOW NOISE AMPLIFIER AND METHOD FOR ENERGY BIASED RADIATION SENSITIVE RECEIVER

[75] Inventor: Andrew S. Rappaport, Belmont, Mass.

[73] Assignee: Panametrics, Inc., Waltham, Mass.

[21] Appl. No.: 312,911

[22] Filed: Oct. 19, 1981

[51] Int. Cl.³ ............................................. G01N 21/27
[52] U.S. Cl. ................................ 250/343; 250/214 A; 250/345
[58] Field of Search ............... 250/214 R, 214 A, 343, 250/344, 345, 350, 351; 330/59, 75, 308; 307/310, 311; 356/437

[56] References Cited
U.S. PATENT DOCUMENTS 3,194,968  7/1965  Masin ............................. 250/214 R
4,218,613  8/1980  Bletz ............................. 250/214 A Primary Examiner—Alfred E. Smith
Assistant Examiner—Carolyn E. Fields
Attorney, Agent, or Firm—Lahive & Cockfield

[57] ABSTRACT

An amplifier, responsive to a photosensitive element operating in a high intensity ambient level, and a method for selecting circuit parameters of the amplifier, take into account differing dynamic mechanisms to provide an optimum tradeoff between signal and noise. The dynamic mechanisms, manifested as electrical noise, affect and are particularly noticeable in the output of the photosensitive element operating in a high energy level environment. The method provides steps for selecting an optimum circuit element for enabling a receiving apparatus to achieve a superior signal to noise figure and hence superior sensitivity to a small AC signal level "riding" on a high DC ambient signal.

1 Claim, 8 Drawing Figures

LOW NOISE AMPLIFIER AND METHOD FOR ENERGY BIASED RADIATION SENSITIVE RECEIVER

BACKGROUND OF THE INVENTION

The invention relates generally to circuitry for generating signal levels in response to the output of a photosensitive element and more particularly to circuitry for generating an output signal level in response to a photosensitive element operating in a high level ambient-energy environment.

It is well known in the literature and among circuit design engineers to design sensitive and satisfactory circuitry using for example photodiodes wherein accuracies of the order of one part in $10^6$ are not uncommon. In each of these systems, however, the measurements are made against relatively low DC background levels so that for example a signal on the order of $10^{-6}$ is made against a zero background level.

In apparatus such as that described in copending application Ser. Nos. 312,936 and 178,190, now U.S. Pat. No. 4,371,785, each assigned to the assignee of this invention, the disclosure of those applications being incorporated herein by reference, AC signal level whose RMS values are on the order of 100 or more decibels below the DC background level are detected. This corresponds to absorption level reference measured with the apparatus of $10^{-6}$ A.U. In this circumstance, presently available technology does not provide measurements with sufficient accuracy and stability to fully make use of the capabilities of an inexpensive photodiode detection system. In particular, prior art designs would lead one to employ circuit parameters which promote deterioration of the available signal precision by at least one or two orders of magnitude.

It should be noted however that a photomultiplier tube, which provides an internal amplification on the order of $10^5$, at low noise levels, provides a satisfactory noise signal although the DC bias saturates at this amplification level. It is only for photosensitive elements such as semiconductor or vacuum photodiodes (wherein external circuit elements are employed to provide the necessary amplification) that the substantial deterioration of the signal to noise figure occurs.

It is therefore an object of the present invention to provide an amplifier, and a method for selecting circuit components for the amplifier, for maximizing the signal to noise figure of the amplified output signal from a photosensitive element operating in a high ambient noise level environment. Other objects of the invention are a method for optimizing the output of a circuit element in order to provide maximum signal resolution in the presence of high ambient noise levels.

Further objects of the invention are an amplifier and a method for selecting amplifier circuit parameters, which enable high reliability, high precision, and low noise level to be obtained in connection with amplifying small AC signal levels from a photosensitive element, and in particular photodiodes, operating at high ambient DC input levels.

SUMMARY OF THE INVENTION

The invention relates to an apparatus having a circuit configuration which includes a photosensitive element and an amplifier responsive to the output of the element for providing an amplifed output signal representative of the photosensitive element electrical output. The apparatus is typically useful in a photometric detection apparatus where the background ambient energy which the photosensitive element sees can be high, and where it is important to maintain as high a signal to noise figure as possible. The present method and apparatus provide a selection mechanism whereby the circuit component(s) of the amplifier can be chosen to maximize the signal to noise figure.

The method features the steps of determining the dynamic impedance, as that term is hereinafter defined for clarity, of the photosensitive element and thereafter selecting a value of at least one circuit component of the amplifier which substantially maximizes the signal to noise figure for the amplifier and photosensitive element circuit configuration. The value of the circuit component is determined for example by numerical methods. The method is particularly important because the signal to noise figure of an amplifier is a function at least of the input power level which the photosensitive element sees, the photosensitive element responsivity, and the photosensitive element dynamic impedance.

In a particular configuration of the amplifier wherein an operational amplifier has resistive feedback, the method features the step of determining the value of the feedback resistor as a function of, at least, the input power level, the photosensitive element responsivity, the dynamic impedance of the photosensitive element, and the operational amplifier input voltage and current noise sources.

A particular configuration of apparatus according to the invention for providing a signal output representative of a small time-varying energy signal in a high ambient energy level environment features a photodetector having a dynamic impedance Z, a high gain operational amplifier connected in a feedback resistor configuration, the amplifier being connected to the output of the photodetector, and the feedback resistor having a resistance value $R_f$ to substantially maximize the expression $$\frac{E_s}{E_{noise}} = \frac{RPQX}{(N)^{\frac{1}{2}}}$$

where $E_s$ is the signal level, OVS/E/$_{noise}$ is the noise signal, R is the responsivity of the photodetector, P is the ambient energy incident on the photodetector, X is the modulation factor, Q is the current transfer ratio of the amplifier (and equal to $R_f$, approximately, when the amplifier gain is high and dynamic impedance is much greater than $R_f$ divided by amplifier gain) and $(N)^{\frac{1}{2}}$ is the rms noise figure of the system when N is given by:

$$N = \frac{R_f^3 4kT + E_a^2(Z+R_f)^2}{Z^2} +$$

$$\frac{4kT[(Z+R_f)^2 + Q^2]}{Z} + Q^2(I_a^2 + 2ePR);$$

and $E_a$ and $I_a$ are respectively the voltage and current input noise figures for the operational amplifier, k is Boltzman's constant, T is the operating temperature of the photodetector, and e is the electronic charge. (Note that all of the equations assume a one hertz bandwidth.)

BRIEF DESCRIPTION OF THE DRAWINGS

Other objects, features, and advantages of the invention will appear from the following description of a preferred embodiment taken together with the drawings in which.

DESCRIPTION OF A PREFERRED EMBODIMENT

Figure 1:
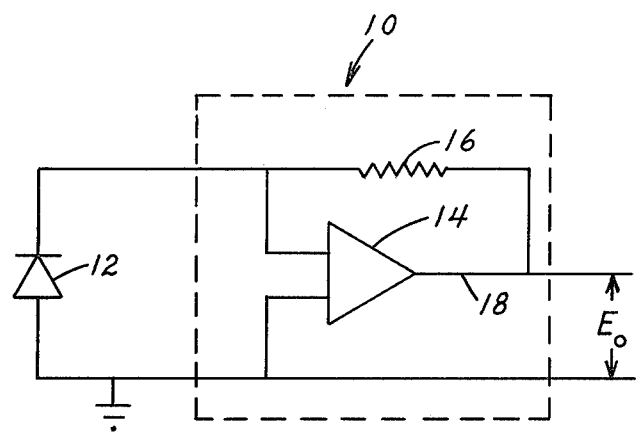
FIG. 1 is a circuit schematic of a typical amplifier for use in connection with a photodiode according to the invention.

Referring to FIG. 1, a typical feedback amplifier circuit 10 is connected to a photosensitive element 12, preferably a semiconductor photodiode. The amplifier 10 has a high gain operational amplifier 14 and a feedback resistor 16. The value of the feedback resistor 16 is selected to maximize the signal-to-noise figure of the signal appearing at the output 18 of the high gain operational amplifier 14. The amplifier is connected in a typical feedback configuration wherein the diode input can be characterized as a current input from substantially a current source.

The selection of the feedback resistor is critical. If the resistor is chosen too high, the amplifier gain will be high but so will the noise gain. If on the other hand the feedback resistor is chosen to be low to avoid noise gain, the amplifier gain will also be low. Thus, the problem is to select the amplifier feedback resistance that provides the best compromise between signal and noise, that is to give an overall circuit configuration having an optimal signal to noise figure.

Figure 2:
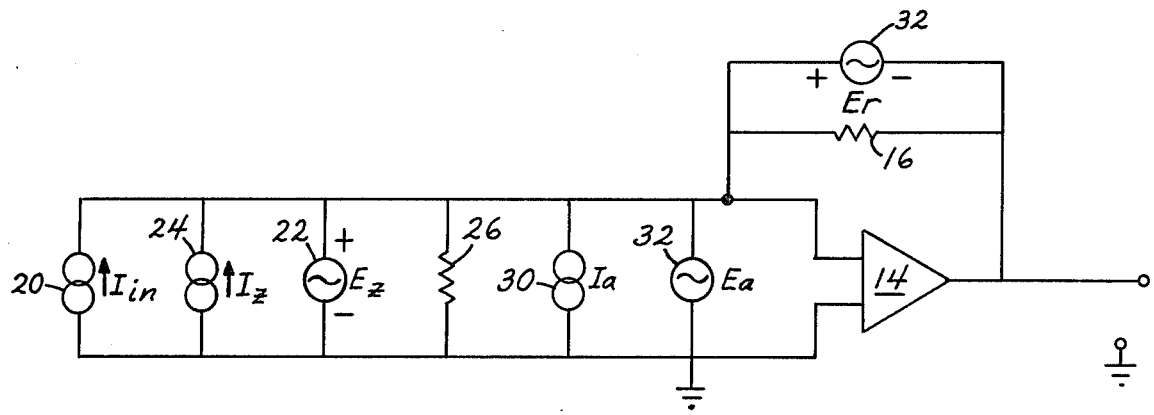
FIG. 2 is an equivalent circuit analysis schematic of the elements to be considered when selecting the circuit values for the amplifier circuit of FIG. 1.

Referring to FIG. 2, the circuit of FIG. 1 can be modeled by a plurality of noise generators. The illustrated semiconductor diode noise components are modeled by a diode shot noise current generator 20, having a current output $I_{SN}$, a diode dynamic impedance noise voltage generator 22, having a voltage output $E_Z$, a diode dynamic impedance noise current generator 24, having a current output $I_Z$, and a diode dynamic impedance 26, having a value Z. The amplifier noise can be modeled by two noise generators, an amplifier input noise current generator 30 having a current output $I_a$ and an amplifier input noise voltage generator 32 having a voltage output $E_a$. The feedback resistance 16 has associated with it a noise voltage generator 32 having an output voltage $E_R$.

With the exception of the dynamic impedance of the diode, impedance 26, each of the elements of the noise model of FIG. 2 can be specified as is well known in the art. Thus, the following table provides a definition of each element of the noise model with the exception of the dynamic impedance Z.

$$I_{SN} = (2ei_d)^{\frac{1}{2}} = (2ePR)^{\frac{1}{2}} \qquad \text{(Eq. 1)}$$

$$I_Z = (4kT/Z)^{\frac{1}{2}} \qquad \text{(Eq. 2)}$$

$$E_Z = (4kTZ)^{\frac{1}{2}} \qquad \text{(Eq. 3)}$$

$I_a$ and $E_a$ are specified by the amplifier manufacturer.

$$E_R = [(4ktR_f)^{\frac{1}{2}} (R_f/(Z + R_f))] \qquad \text{(Eq. 4)}$$

where $i_d$ is the diode current, P is the DC optical power level in watts, R is the detector responsivity (which may be a function of energy frequency) in amperes per watt, e is the value of electronic charge, T is the operating temperature in degrees Kelvin, and k is Boltzman's constant.

The dynamic impedance Z of the semiconductor photodiode is not specified in the literature or in the manufacturer's specifications.

At the outset, the difference between the dynamic impedance of the photodiode, as that term is employed herein, and the "DC" impedance of the photodiode must be understood. The DC impedance of the photodiode is the impedance which results from measuring the voltage and current of the diode at different power input levels. The resulting impedance versus power curve provides the vehicle for determining the dynamic impedance of the photodiode, that is, the impedance which a small AC signal riding atop a DC ambient power level sees. The dynamic and DC impedances of the photodiode will in general be different and are related to one another as described below. Since the manufacturers of semiconductor photodiodes, for example, do not specify either the dynamic impedance or the DC impedance as a function of power input, the dynamic impedance must be experimentally determined in order to complete the noise model. This function can be experimentally determined using the test circuit of FIG. 3. The photodiode equivalent circuit for determining the dynamic impedance is shown in FIG. 4.

Figure 3:
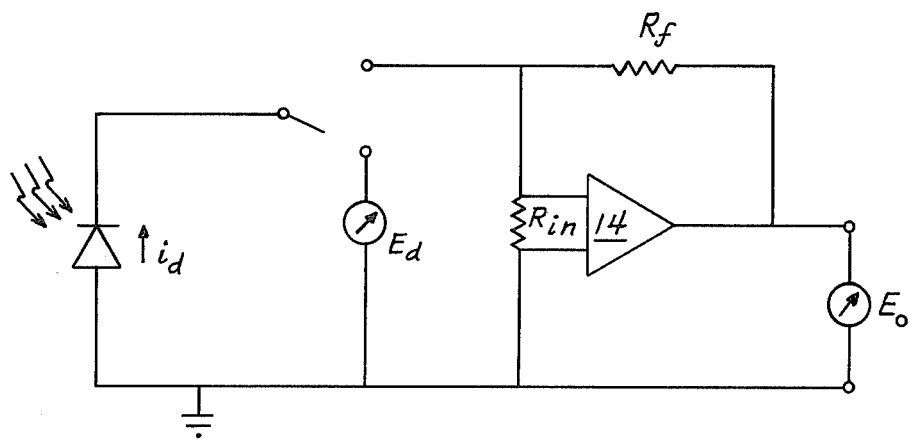
FIG. 3 is a test circuit employed in the determination of dynamic impedance.
Figure 4:
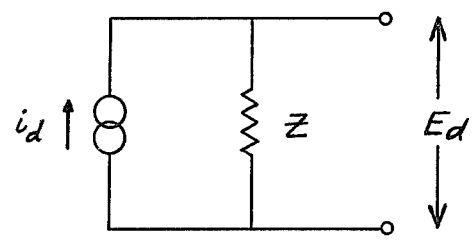
FIG. 4 is a photodiode equivalent circuit for determining dynamic impedance.

Referring to FIG. 3, for a given power level input, the photodiode produces a diode current $i_d$, and has a voltage $E_d$ across the diode (D.C.) impedance ($Z_{DC}$). Referring to the test circuit of FIG. 3, the diode current $i_d$ is measured using the output voltage $E_o$ of the amplifier ($i_d = E_o/R_f$) and thus the D.C. diode impedance equals $E_d/(E_o/R_f)$. If desired, the amplifier offset can be included so that $E_o$ equals the measured voltage value minus the amplifier offset voltage value.

The circuit of FIG. 3 was employed to plot the D.C. impedance versus optical power input. The experimental data generated in this way indicated, that for the class of silicon photodiodes, the D.C. impedance took approximately the general form $(B)(P_m^{-A})$ where A and B are constants, and $P_m$ represents the optical power input at the measured wavelength. The dynamic impedance Z can then be determined to equal the DC impedance times a factor of $(1-A)$. The equations below indicate how this result is achieved.

Since $$\frac{E_d}{i_d} = Z_{DC} \quad \text{(Eq. 5)}$$

and $$i_d = RP. \quad \text{(Eq. 6)}$$

Then:

$$E_d = i_d Z_{DC} = RPZ_{DC} \quad \text{(Eq. 7)}$$

Also:

$$Z = \frac{dE_d}{di_d} = \frac{dE_d}{dP} \cdot \frac{dP}{di_d} = \frac{1}{R} \frac{dE_d}{dP} \quad \text{(Eq. 8)}$$

or:

$$Z = \frac{1}{R} \frac{d(RPZ_{DC})}{dP} \quad \text{(Eq. 9)}$$

assuming:

$$Z_{DC} = BP_m^{-A}; \quad \text{(Eq. 10)}$$

$$Z = BP_m^{-A}(1 - A) = Z_{DC}(1 - A) \quad \text{(Eq. 11)}$$

Since $P_m$ is a function of current and the responsivity, and responsivity generally varies with wavelength, it is more meaningful to express dynamic impedance as:

$$Z = (B \cdot (i_d/R_m)^{-A})(1 - A) \quad \text{(Eq. 11A)}$$

where $i_d$ equals the current through the diode and $R_m$ is the responsivity at the wavelength at which measurements are being made.

Also since $i_d = PR$ for any wavelength, (where P is simply the input optical power), and R is the responsivity at the wavelength $\lambda$, then $$Z = (B \cdot (PR/R_m)^{-A})(1 - A) \quad \text{(Eq. 11B)}$$

Equations 11A and 11B are each expressions for Z which are valid at all wavelengths of interest.

Having then estimated all of the noise generators for the measurement apparatus, the expected output noise voltage (rms) is equal to the square root of the sum of the individual noise source voltages squared.

Figure 3A:
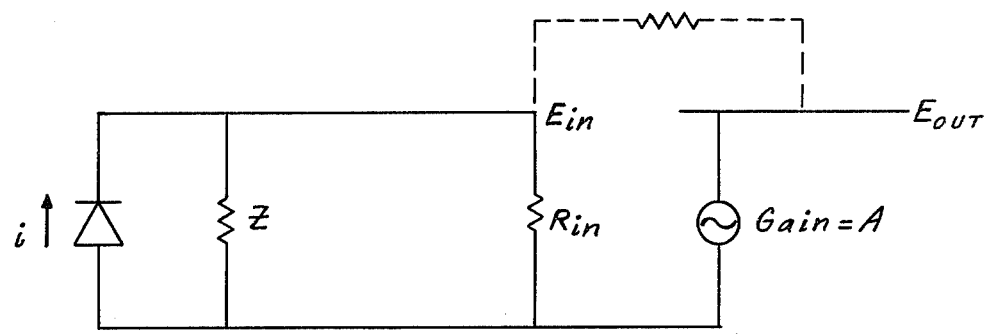
FIG. 3A is an equivalent circuit analysis schematic taking into account amplifier input impedance.

Referring to FIG. 3A, assuming that the amplifier has an input impedance $R_{in}$, the amplifier has a current transfer ratio, Q, where $$Q = \frac{E_o}{i_{in}} = \frac{AE_{in}}{i_{in}} = A \frac{R_{in} \cdot Z}{R_{in} + Z} = A \frac{[R_f/(A+1)] \cdot Z}{[R_f/(A+1)] + Z}$$

where A is the amplifier gain.

For large A, $$Q \simeq \frac{R_f Z A}{R_f + ZA}$$

then for $A \gg 1$ and $Z \gg R_f/A$, $$Q \simeq R_f$$

The noise voltage thus equals:

$$\overline{E_{noise}} = [[E_o(I_{SN})]^2 + [E_o(I_z)]^2 + [E_o(E_z)]^2 + \quad \text{(Eq. 12)}$$

$$[E_o(I_a)]^2 + [E_o(E_a)]^2 + [E_o(E_R)]^2]^{\frac{1}{2}}$$

where:

$$E_o(I_{SN}) = I_{SN}Q = Q(2ePR)^{\frac{1}{2}} \quad \text{(Eq. 13)}$$

$$E_o(I_z) = I_z Q = Q(4kT/Z)^{\frac{1}{2}} \quad \text{(Eq. 14)}$$

$$E_o(I_a) = I_a Q \quad \text{(Eq. 15)}$$

The noise voltage gain of the circuit is $(Z+R_f)/Z$. Therefore:

$$E_o(E_Z) = [(Z + R_f)/Z](4kTZ)^{\frac{1}{2}} \quad \text{(Eq. 16)}$$

$$E_o(E_a) = [(Z + R_f)/Z]E_a \quad \text{(Eq. 17)}$$

$$E_o(E_R) = [(R_f/(Z + R_f)](4kTR_f)^{\frac{1}{2}}[(Z + R_f)/Z] \quad \text{(Eq. 18)}$$

$$= (R_f/Z)(4kTR_f)^{\frac{1}{2}}$$

Thus the expected rms noise signal voltage, OVS/E/noise, equals:

$$\overline{E_{noise}} = (N)^{\frac{1}{2}} = \left( \frac{R_f^2 4kT + E_a^2(Z + R_f)^2}{Z^2} + \right.$$

$$\left. \frac{4kT[(Z + R_f)^2 + Q^2]}{Z} + Q^2(I_a^2 + 2ePR) \right)^{\frac{1}{2}} \quad \text{(Eq. 19)}$$

Having determined the expected rms noise level, the resulting signal voltage output of the amplifier is equal to the photodiode current times the feedback resistance ($i_d R_f$). Since the AC photodiode component of current equals the diode responsivity R times the optical power input P times a modulation factor X (a factor between zero and one), the AC output signal $E_s$ equals:

$$E_s = RPQX. \quad \text{(Eq. 20)}$$

It is then possible to calculate the signal to noise figure as a function of the system operating parameters and, using numerical analysis techniques, this can then be used to maximize the signal to noise figure, $E_s/OVS/E/_{noise}$. In this manner, the optimum value of various components can be found.

EXAMPLE

Figure 5:
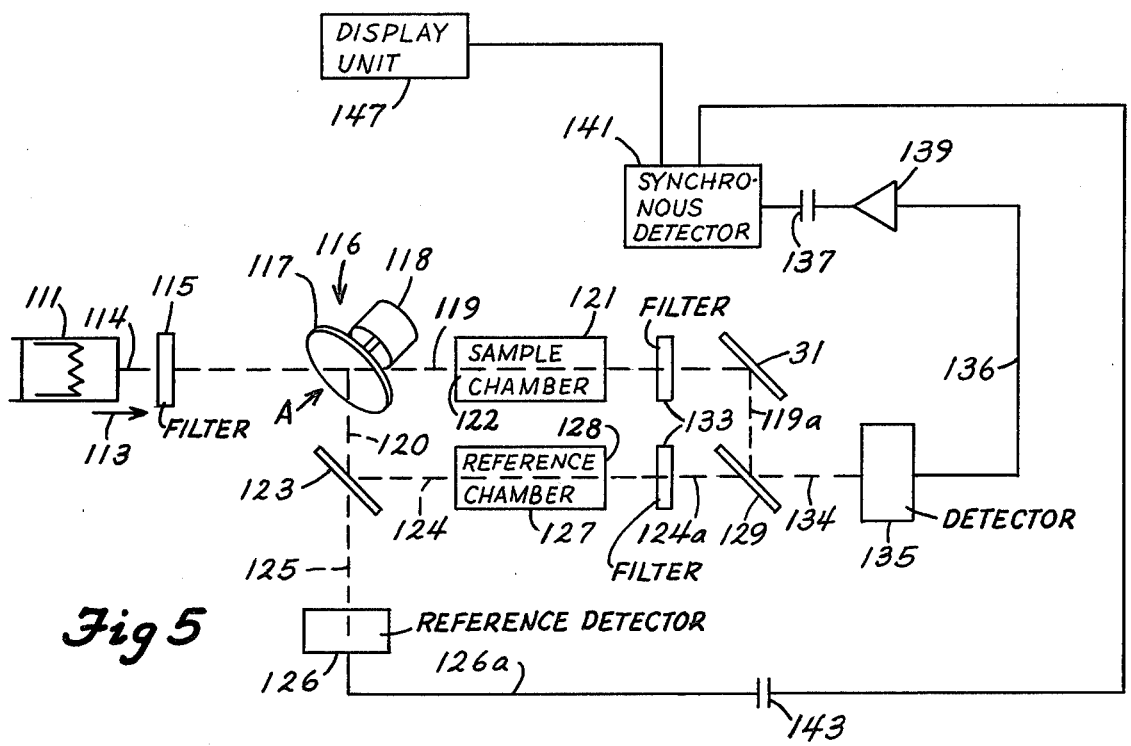
FIG. 5 is a schematic view of a fluid detection and analysis system in which the present invention is incorporated.

In a typical application, referring to FIG. 5, the amplifier of the present invention is advantageously employed in connection with the photometric detection of fluids.

Referring to FIG. 5, in a gas detection system, a source 111 of polychromatic infrared or other electromagnetic radiation directs a preferably collimated beam 114 outwardly in the direction of an arrow 113. The beam passes through the filter 115 which, in this illustrated embodiment, allows passage of only a narrow bandwidth of frequencies, including a wavelength for which a gas to be investigated has a characteristic absorption. The filtered beam is incident on a beam-modulation element 116. Illustrated element 116 has a planar disk-shaped member 117 which is oscillated by a rotation element 118. Illustrated disk 117 oscillates in a sinusoidal manner, although it will be clear to those practiced in the art that other speed relationships can be employed. Illustrated disk 117 is constructed so that its transmittance and reflectance, at wavelengths of interest, vary linearly with the angular position of the disk. For example, the disk surface may include a metallic layer whose thickness, and accordingly its reflective properties, varies linearly with angle. Preferably, the disk is dielectric coated to reduce energy losses.

The disk 117 divides the incident beam into a transmitted beam 119 and a reflected beam 120. Since the reflectance (R) and transmittance (T) are related by the equation $R = 1 - T$ (assuming negligible absorption by the disk which is not a limitation of the apparatus), the variation in intensity of the reflected beam will be "oppositely directed" to that of the transmitted beam. Although the disk may be structured to produce any of a variety of mathematical relationships between the reflected and the transmitted beams, in this particular embodiment a sinusoidal relationship between the two is utilized. In other words, the amplitudes of the reflected and transmitted beams, when the disk is oscillated in a sinusoidal manner, vary sinusoidally, 180° out of phase with each other.

The transmitted, or sample, beam 119 is directed to and through a sample chamber 121 which encloses a sample of the gaseous medium being investigated. If one or more gases present in the sample chamber has an absorption characteristic at a particular wavelength of the incident radiation, the sample beam will be attenuated (a portion absorbed) during its passage through the sample chamber 121 along its optical path 122. The amount of attenuation will be proportional to the density of absorbing gas within the sample chamber and it is that attenuation which the apparatus is designed to accurately determine.

Meanwhile, the reflected beam 120 is directed onto a fixed beam splitter 123 which further divides the reflected beam into major and minor reference beams 124 and 125. The major reference beam 124 is reflected by the beam splitter 123, while the minor reference beam 125 is transmitted through the beam splitter and is incident upon a reference detector 126. The reference detector 126, a photodetector, produces, in response to minor reference beam 125, an AC signal over a line 126a of the same frequency as the modulation frequency of the sinusoidally varying, reflected beam 120. That AC signal will be used during synchronous detection as described in more detail below. The major reference beam 124 is directed to and through a second, or reference, chamber 127, along its optical path 128. Chamber 127 is preferably identical in structure to the sample chamber 121, and contains a known reference gas which can include a known quantity of the gas to be investigated or detected.

At a beam combining element 129, which functions generally in the reverse manner of the beam splitter 123, an exiting reference beam 124a is combined with an exiting sample beam 119a, which in the illustrated embodiment has been reflected by a mirror 31 onto the beam combining element 129. When the beams 119a and 124a are combined, it is important that both beams have traversed substantially identical optical paths, to insure that the original 180° out of phase relationship has been maintained. Thus, when the attenuation in both optical paths is the same, which can under some circumstances be equated to the same quantity of sample gas in the sample and the reference chambers, the combined beam will, as described below according to the invention, have a constant intensity.

Figure 6:
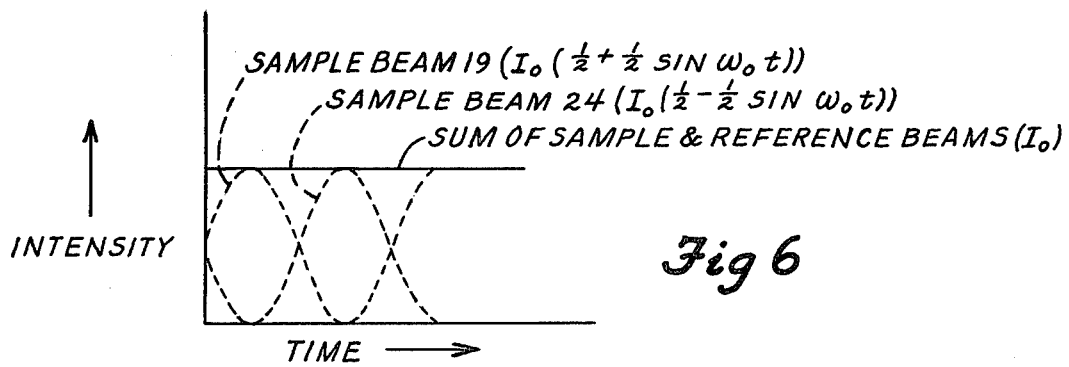
FIG. 6 is a graphical representation showing the respective amplitudes of the sample and reference beams and the resulting output of the detector in the absence of a sample gas differential absorption.

For example, assume that at point A the intensity of the original beam is $I_o$. The intensity of the transmitted portion (beam 119) (ignoring losses) will be $I_o(\frac{1}{2} + \frac{1}{2} \sin w_o t)$, where $w_o$ corresponds to the frequency of angular oscillation of the rotating disk 117. The reflected portion (beam 120) will have an intensity $I_o(\frac{1}{2} - \frac{1}{2} \sin w_o t)$. Upon emergence from their respective chambers (and ignoring the losses at beam splitter 123), the transmitted sample beam has an intensity $K_1 I_o(\frac{1}{2} + \frac{1}{2} \sin w_o t)$ and the reflected, reference beam has an intensity $K_2 I_o(\frac{1}{2} - \frac{1}{2} \sin w_o t)$ where $K_1$ and $K_2$ represent the attenuation of the respective beams in passing through the sample and reference chambers. If the attenuations are equal, or are somehow made equal ($K_1 = K_2 = K_o$), the combined beam will have an intensity equal to $K_o[I_o(\frac{1}{2} + \frac{1}{2} \sin w_o t) + I_o(\frac{1}{2} - \frac{1}{2} \sin w_o t)] = K_o I_o$, where $K_o$ is a constant, time-independent value. Thus, $K_o$ represents the attenuation, if any, in the chambers 121 and 127, when, for example, the sample and reference chambers are identical in structure and contain equal amounts of identical gases. (See FIG. 6 for a graphic representation of these relationships.)

Referring to the illustrated embodiment of FIG. 5, variable neutral density filters 133 can be positioned in the paths of either or both of the exiting sample and the reference beams to balance their intensities during dynamic calibration of the apparatus, i.e., in a reference condition when both chambers 121, 127 contain selected amounts (which may be an empty condition) of the sample gas(es). That is, the intensity of one of the beams can be attenuated to compensate for transmission or absorption losses in the other beam, to insure that for the standard reference condition, a constant intensity is achieved upon combination to form beam 134. For example, the intensity of the exiting sample beam 119a can be attenuated to compensate for the slight loss in the reflected beam 120 at beam splitter 123.

Figure 7:
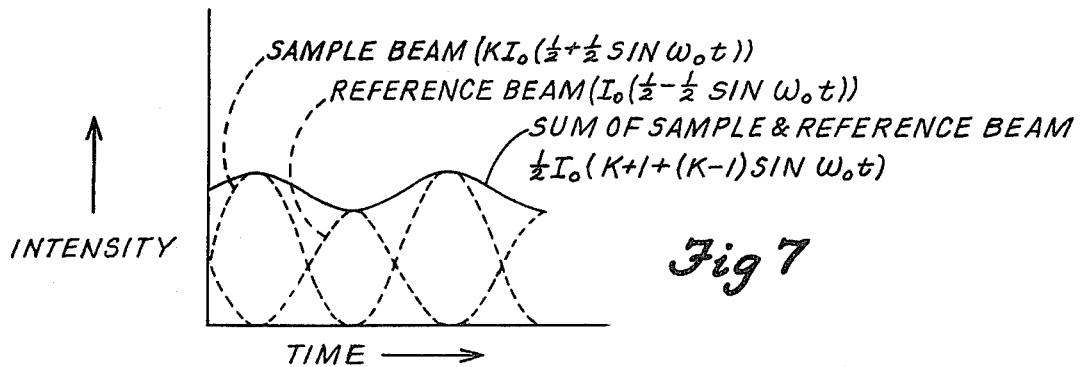
FIG. 7 is a figure similar to FIG. 6 showing the respective amplitudes of the sample and reference beams in the presence of sample gas differential absorption.

The combined beam 134 is directed onto a conventional detector 135, for example an infrared photodetector when infrared radiation is employed, which produces a voltage output over a line 136, proportional to the intensity of the radiation incident thereon. In the case of a constant intensity beam, the output of the detector will be a constant voltage. A different situation exists when there is a quantity of sample gas in the sample chamber 121 which effects a different absorption than the gas which was in sample chamber 121 during calibration of the system. Using the same assumptions as recited above regarding the intensity of the initial radiation, the intensity of the beam emerging from the sample chamber can be characterized as $KI_o(\frac{1}{2} + \frac{1}{2} \sin w_o t)$ where K is a positive factor less than unity different than $K_o$. Thus, the intensity of the recombined beam incident upon the detector will no longer be constant but will be represented by $[KI_o(\frac{1}{2} + \frac{1}{2} \sin w_o t) + I_o K_o(\frac{1}{2} - \frac{1}{2} \sin w_o t)] = \frac{1}{2} I_o[(K + K_o) + (K - K_o) \sin w_o t]$ (see FIG. 7). This time varying amplitude has an AC component ($\frac{1}{2} I_o[(K - K_o) \sin w_o t]$) superimposed on the DC signal $\frac{1}{2}(K + K_o) I_o$. The AC component represents the difference between the gaseous medium being measured and the reference value employed during system calibration. It is therefore that AC value which carries the information of interest and the AC component output from the detector can be measured accurately using advantageously an amplifier according to the invention and a synchronous detector as follows.

Still referring to FIG. 5, the output of the detector 135 is directly connected to an amplifier 139. The output of amplifier 139 is coupled through a capacitor 137 to a synchronous detector 141. The synchronous detector 141 also receives the AC component of the output signal from the reference detector 125 through a second coupling capacitor 143. The synchronous detector 141 thus synchronously detects the AC component of the signal from the detector 135 and produces an output proportional to the amplitude of the information AC signal from amplifier 139, to drive a display unit 147 such as, for example, an X-Y plotter, or a digital readout. The display unit thus indicates at least the amplitude of the AC component in the output of detector 135. Clearly in the case of a pure DC output from the detector 135, the first coupling capacitor 137 will block passage of the DC signal to the synchronous detector 141, resulting in a zero AC output therefrom.

The amplifier 139 has a configuration, according to the invention, such as that shown illustratively in FIG. 1. The components of the amplifier are chosen according to the discussion above to provide a maximum signal to noise figure for the apparatus. The value of the components are chosen in response to the sensitivity or responsivity R of the photodiode at the frequency of interest, and the optical power input, that is, the DC component of power input, incident upon the photodiode in the operating system. For a typical operating detection apparatus, according to the invention, the operating parameters are as follows. The parameters are selected based upon the use of an operational amplifier such as Burr-Brown No. 3522 having an open loop gain of $1 \times 10^4$, an input noise voltage of $2.1 \times 10^{-7}$ V/(Hz)$^{\frac{1}{2}}$, and an input noise current of $1 \times 20^{-12}$ A/(Hz)$^{\frac{1}{2}}$ as specified by the manufacturer. The photodiode is a Vac-Tek VTB-5041 silicon semiconductor photodiode. The typical operating power directed at the diode is $1 \times 10^{-5}$ Wt. and the diode has a responsivity of 0.45 A/Wt. at 6328 Å. Under these operating conditions, the signal to noise figure for the circuit equals $$\frac{E_s}{E_{noise}} = \frac{RPQX}{(N)^{\frac{1}{2}}}$$

where N is defined by Equation 19.

The signal to noise figure has a minimum value, which can be calculated by well know numerical methods.

It is important to note that the signal to noise figure for the system is a function of the feedback resistance $R_f$, the amplifier input noise voltage and current, the ambient DC power level P incident on the photoreceptor (in watts), and the photodetector responsivity R. Thus, if the system ambient operating light level changes, the value of the feedback resistance should probably also change correspondingly.

Additions, subtractions, deletions, and other modifications of the disclosed preferred embodiment of the invention will be obvious to those skilled in the art and are within the scope of the following claims.

What is claimed is:

1. A photometric analysis apparatus for analyzing a fluid medium having at least one sample component having a characteristic absorption wavelength of interest, comprising:

a beam source of electromagnetic radiation including radiation at at least said one characteristic wavelength for providing a directed beam containing said characteristic wavelength, beam modulation means in the path of said beam for providing first and second component beams whose intensities vary 180° out of phase at the rate of repetitive movement of said beam modulation means, a sample fluid holding chamber having a first optical path passing therethrough, said sample chamber being in the path of one of said first and second component beams for passing said one component through said sample chamber along the sample chamber optical path passing therethrough, a reference fluid holding chamber having a second optical path passing therethrough, said reference fluid chamber being in the path of the other of said first and second component beams for passing said other component beam through said reference chamber along the reference chamber optical path passing therethrough, means for combining said first and second component beams, after passage through said sample fluid holding chamber and said reference fluid holding chamber, and means for measuring the AC component of said combined beam comprising a photodetector having a dynamic impedance Z, a high gain operational amplifier connected in a feedback resistor configuration, said amplifier being connected to the output of said photodetector, the feedback resistor having a value $R_f$ to substantially maximize the expression for the signal to noise figure:

$$\frac{E_s}{E_{noise}} = \frac{RPR_fX}{(N)^{\frac{1}{2}}}$$

wherein R is the responsivity of the photodetector, P is the ambient energy incident on said photodetector, X is the modulation factor, and $(N)^{\frac{1}{2}}$ is the rms noise figure of the system where N is given by $$N = \frac{R_f^4 4kT + E_a^2(Z + R_f)^2}{Z^2} + \frac{4kT[(Z + R_f)^2 + R_f^2]}{Z} +$$

$$R_f^2(I_a^2 + 2e\,PR); \text{ and}$$

$E_a$ and $I_a$ are respectively the voltage and current input noise figures for the operational amplifier, k is Boltzman's constant, T is the operating temperature of the photodetector, and e is the electronic charge.

* * * * *